United States Patent
Sun

(10) Patent No.: US 8,587,115 B2
(45) Date of Patent: Nov. 19, 2013

(54) HEAT DISSIPATION SUBSTRATE AND MANUFACTURING METHOD THEREOF

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 28 days.

(21) Appl. No.: 13/526,531

(22) Filed: Jun. 19, 2012

(65) Prior Publication Data

US 2013/0273388 A1   Oct. 17, 2013

(30) Foreign Application Priority Data

Apr. 12, 2012   (TW) .............................. 101113024 A

(51) Int. Cl.
*H01L 27/01*   (2006.01)
(52) U.S. Cl.
USPC ............ 257/712; 257/713; 257/717; 257/720
(58) Field of Classification Search
USPC ........................ 257/706, 712, 713, 717, 720
See application file for complete search history.

(56) References Cited

U.S. PATENT DOCUMENTS

| | | | | |
|---|---|---|---|---|
| 5,213,877 A | * | 5/1993 | Yoshida et al. | 428/209 |
| 6,040,039 A | * | 3/2000 | Ikeda et al. | 428/210 |
| 7,425,762 B2 | * | 9/2008 | Hasebe et al. | 257/712 |
| 7,447,032 B2 | * | 11/2008 | Ishikawa | 361/704 |
| 7,470,982 B2 | * | 12/2008 | Takashima et al. | 257/706 |
| 2003/0085425 A1 | * | 5/2003 | Darmawan | 257/347 |
| 2003/0201530 A1 | * | 10/2003 | Kurihara et al. | 257/712 |
| 2004/0207073 A1 | * | 10/2004 | Hasebe et al. | 257/706 |

* cited by examiner

*Primary Examiner* — Cathy Lam
(74) *Attorney, Agent, or Firm* — Jianq Chyun IP Office

(57) ABSTRACT

A heat dissipation substrate including a metal substrate, a metal layer, an insulating material layer and a patterned conductive layer is provided. The metal layer is disposed on the metal substrate and entirely covers the metal substrate. The metal layer has a first metal block and a second metal block surrounding the first metal block. A thickness of the first metal block is greater than a thickness of the second metal block. The insulating material layer is disposed on the second metal block. The patterned conductive layer is disposed on the insulating material layer and on the first metal block.

10 Claims, 5 Drawing Sheets

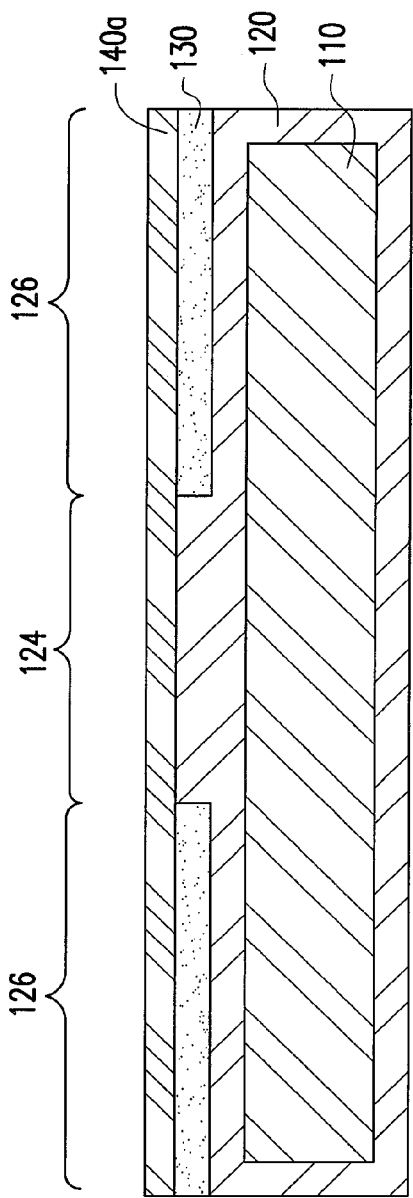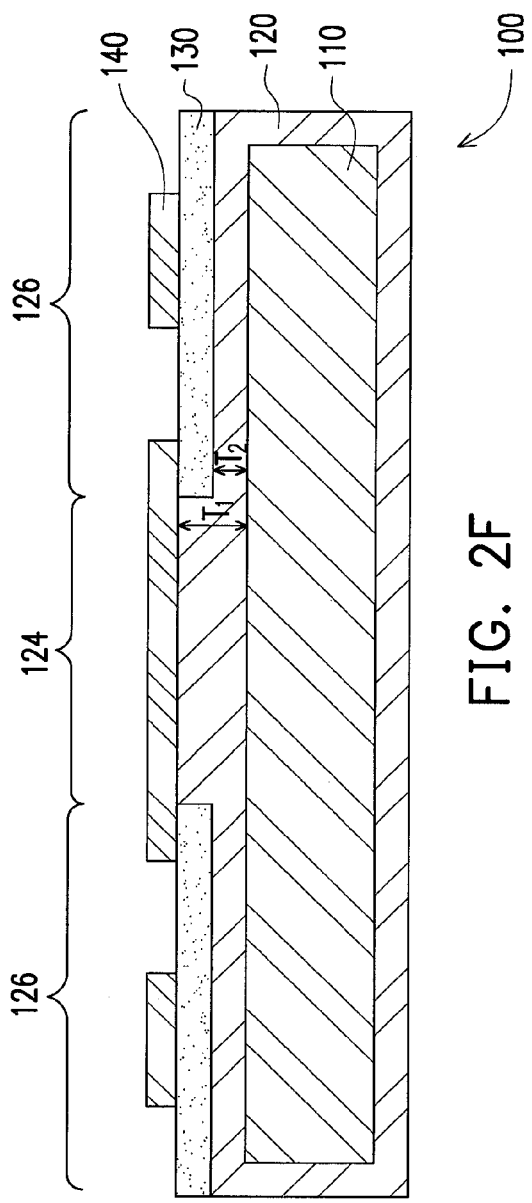

HEAT DISSIPATION SUBSTRATE AND MANUFACTURING METHOD THEREOF

CROSS-REFERENCE TO RELATED APPLICATION

This application claims the priority benefit of Taiwan application serial no. 101113024, filed on Apr. 12, 2012. The entirety of the above-mentioned patent application is hereby incorporated by reference herein and made a part of this specification.

BACKGROUND OF THE INVENTION

1. Field of the Invention

The invention relates to a substrate, and more particularly, to a heat dissipation substrate requiring high thermal conductivity and a manufacturing method thereof.

2. Description of Related Art

Purposes of chip packaging are to provide a suitable signal path, a heat conduction path and a structure protection for a chip. Conventional wire bonding technique generally uses a leadframe to serve as a carrier of the chip. As the contact density of the chip gradually increases, the leadframe is no longer able to provide higher contact density, so that a package substrate having a high contact density is utilized to replace the leadframe, and the chip is packaged onto the package substrate through conductive media such as metal wires or bumps.

The package substrate is mainly formed by a metal substrate and a plurality of patterned conductive layers on the metal substrate and at least one insulating layer, wherein the insulating layer is disposed between two adjacent patterned conductive layers. Generally, an adhesion layer is disposed between the chip and the package substrate. The chip is fixed on the package substrate through the adhesion layer and is electrically connected to the package substrate, and heat generated by the chip can be conducted to the metal substrate through the adhesion layer, the patterned conductive layers and the insulating layer. However, since thermal conductivities of the adhesion layer and the insulating layer are relatively poor, when heat generated by the chip is conducted to the metal substrate through the adhesion layer and the insulating layer, a thermal resistance is increased, which may cause poor heat conduction. Therefore, efficiently conducting heat generated by the chip to the exterior is an issue of concern in the R&D for those designers.

SUMMARY OF THE INVENTION

The invention provides a heat dissipation substrate having a better thermal conductivity effect.

The invention provides a manufacturing method of a heat dissipation substrate which is suitable for manufacturing the aforementioned heat dissipation substrate.

In an embodiment of the invention, a heat dissipation substrate that includes a metal substrate, a metal layer, an insulating material layer, and a patterned conductive layer is provided. The metal layer is disposed on the metal substrate and entirely covers the metal substrate. The metal layer has a first metal block and a second metal block surrounding the first metal block. A thickness of the first metal block is greater than a thickness of the second metal block. The insulating material layer is disposed on the second metal block. The patterned conductive layer is disposed on the insulating material layer and on the first metal block.

According to an embodiment of the invention, the metal substrate includes an aluminum substrate.

According to an embodiment of the invention, a material of the metal layer includes copper.

According to an embodiment of the invention, the thickness of the second metal block is less than or equal to half of the thickness of the first metal block.

In an embodiment of the invention, a manufacturing method of a heat dissipation substrate is provided, wherein the manufacturing method comprising the following steps. A metal substrate is provided. A metal layer is formed on the metal substrate, wherein the metal layer entirely covers the metal substrate. A plurality of recesses is formed on the metal layer, wherein the recesses define the metal layer into a first metal block and a second metal block surrounding the first metal block, and a thickness of the first metal block is greater than a thickness of the second metal block. An insulating material layer is formed on the recesses. A patterned conductive layer is formed on the insulating material layer and on the first metal block.

According to an embodiment of the invention, a method of forming the recesses on the metal layer includes a half-etching process.

According to an embodiment of the invention, the thickness of the second metal block is less than or equal to half of the thickness of the first metal block.

According to an embodiment of the invention, a method of forming the insulating material layer on the recesses includes thermal compression process or coating process.

According to an embodiment of the invention, the steps for forming the patterned conductive layer include: performing a surface treatment to the insulating material layer and on the first metal block, performing an electroplating process for forming a conductive layer on the insulating material layer and on the first metal block, and performing a patterning process to the conductive layer for forming a patterned conductive layer.

According to an embodiment of the invention, a copper foil layer is laminated on the insulating material layer and on the first metal block before forming the patterned conductive layer.

Based on the above, the heat dissipation substrate of the invention utilizes the metal layer to entirely cover the metal substrate, and thus when disposing a heat generating element on the heat dissipation substrate, heat generated by the heat generating element may be quickly conducted to the exterior through the patterned conductive layer, the metal layer and the metal substrate. Consequently, the heat dissipation substrate of the invention may effectively dissipate heat generated by the heat generating element, thereby improving usage efficiency and durability of the heat generating element.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. The drawings illustrate exemplary embodiments and, together with the description, serve to explain the principles of the disclosure.

FIG. 2A to FIG. 2G are schematic cross-sectional views illustrating a manufacturing method of a heat dissipation substrate according to an embodiment of the invention.

DESCRIPTION OF EMBODIMENTS

Figure 1:
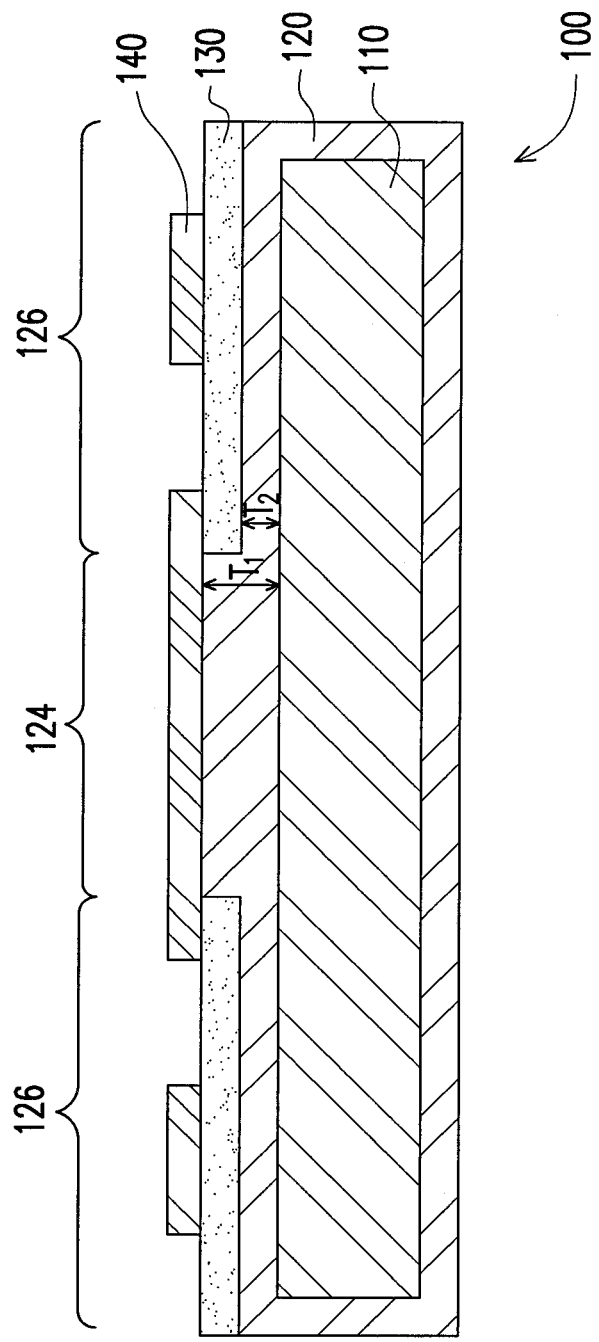
FIG. 1 is schematic cross-sectional view illustrating a heat dissipation substrate according to an embodiment of the invention.

FIG. 1 is schematic cross-sectional view illustrating a heat dissipation substrate according to an embodiment of the invention. With reference to FIG. 1, in the embodiment, a heat dissipation substrate 100 includes a metal substrate 110, a metal layer 120, an insulating material layer 130, and a patterned conductive layer 140.

Specifically, the metal substrate 110 of the embodiment is, for example but not limited to, a copper substrate, a copper alloy substrate, an aluminum substrate, or an aluminum alloy substrate with a good thermal conductivity, capable of rapidly conducting heat generated by the heat generating element, so as to reduce the operating temperature of the heat generating element. Herein, the metal substrate 110 is, for example, an aluminum substrate. The metal layer 120 is disposed on the metal substrate 110 and entirely covers the metal substrate 110, wherein a material of the metal layer 120 is, for example, copper. Specifically, the metal layer 120 has a first metal block 124 and a second metal block 126 surrounding the first metal block 124, wherein the thickness of the first metal block 124 is T1, the thickness of the second metal block 126 is T2, and the thickness T1 of the first metal block 124 is greater than the thickness T2 of the second metal block 126. Preferably, the thickness T2 of the second metal block 126 is less than or equal to half of the thickness T1 of the first metal block 124. The insulating material layer 130 is disposed on the second metal block 126. The patterned conductive layer 140 is disposed on the insulating material layer 130 and on the first metal block 124.

Because the heat dissipation substrate 100 utilizes the metal layer 120 to entirely cover the metal substrate 110, a heat generating element (not shown) may be disposed on the patterned conductive layer 140 above the first metal block 124 when the heat generating element is disposed on the heat dissipation substrate 100. Heat generated by the heat generating element may be rapidly conducted to the exterior sequentially through the patterned conductive layer 140, the first metal block 124 of the metal layer 120 and the metal substrate 110. Consequently, the heat dissipation substrate 100 may effectively dissipate heat generated by the heat generating element, thereby improving usage efficiency and durability of the heat generating element. Furthermore, since the aluminum substrate is utilized as the metal substrate 110, an overall weight of the heat dissipation substrate 100 may be lighter compared to a copper substrate of the same volume, and a cost thereof is relatively low.

According to the above descriptions, only the structure of the heat dissipation substrate 100 of the invention is introduced, and a manufacturing method thereof is not mentioned. Therefore, another embodiment is provided below to describe the manufacturing method for the heat dissipation substrate 100 with reference to FIG. 2A to FIG. 2G.

Figure 2A:
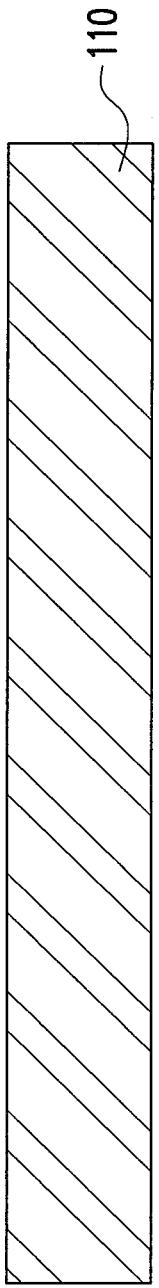

FIG. 2A to FIG. 2G are schematic cross-sectional views illustrating a manufacturing method of a heat dissipation substrate according to an embodiment of the invention. With reference to FIG. 2A, a manufacturing method of a heat dissipation substrate 100, firstly, provides a metal substrate 110. In the embodiment, the metal substrate 110 is, for example but not limited to, a copper substrate, a copper alloy substrate, an aluminum substrate, or an aluminum alloy substrate with a good thermal conductivity. Herein, the metal substrate 110 is, for example, an aluminum substrate with a thickness in a range between of 0.5 mm to 2 mm.

Figure 2B:
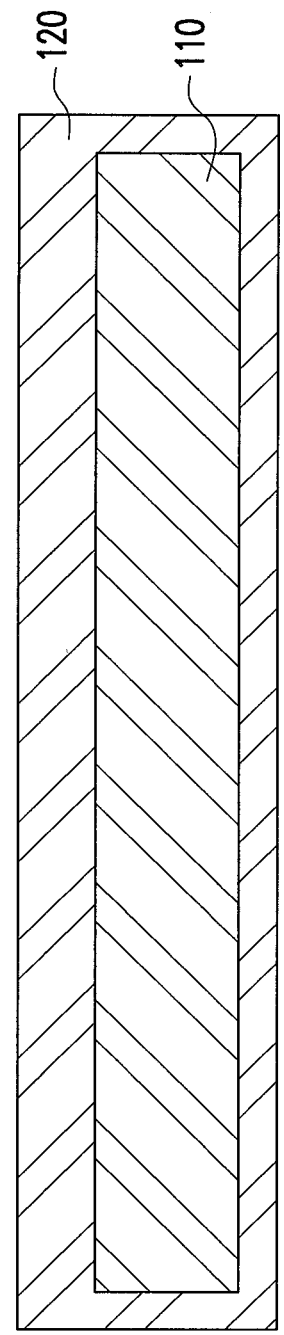

With reference to FIG. 2B, a metal layer 120 is formed on the metal substrate 110, wherein the metal layer 120 entirely covers the metal substrate 110. In the embodiment, the metal layer 120 with a thickness in a range between 0.005 mm to 0.3 mm is, for example, formed through an electroplating process. Besides, a material for the metal layer 120 is, for example, copper.

It is noted that, in the other embodiments, in order to facilitate the formation process of the metal layer 120, a surface treatment may be performed on the metal substrate 110 before forming the metal layer 120. Herein, the step of surface treatment is, for example, to form a medium layer (not shown) on the metal substrate 110 through a physical or a chemical process, and a material of the medium layer is, for example, zinc or copper. Then, the metal layer 120 is formed on the metal substrate 110 with the electroplating process by utilizing the medium layer as an electroplating seed layer.

Figure 2C:
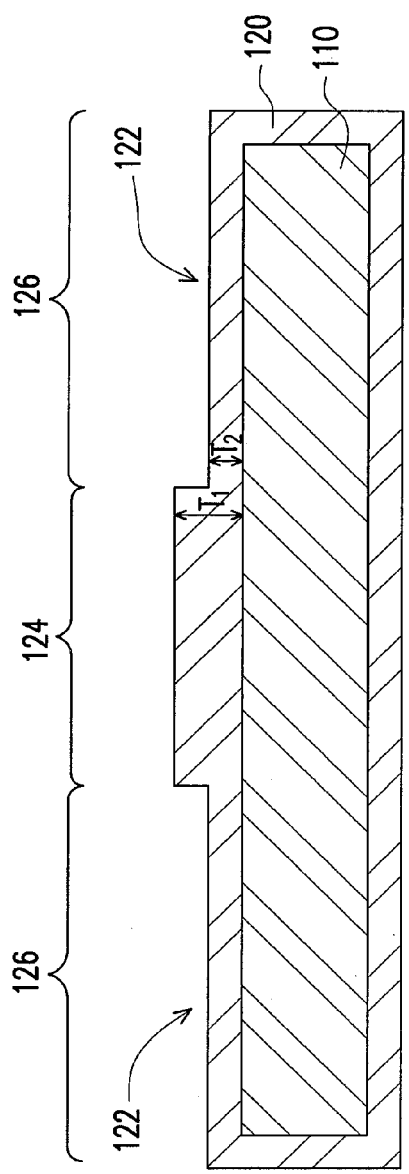

With reference to FIG. 2C, a plurality of recesses 122 is formed on the metal layer 120, wherein a method of forming the recesses 122 on the metal layer 120 includes a half-etching process. In detail, the recesses 122 may define the metal layer 120 into a first metal block 124 and a second metal block 126 surrounding the first metal block 124, wherein the recesses 122 are corresponding to the second metal block 126. Specifically, a thickness of the first metal block 124 is T1, a thickness of the second metal block 126 is T2, and the thickness T1 of the first metal block 124 is greater than the thickness T2 of the second metal block 126. Preferably, the thickness T2 of the second metal block 126 is less than or equal to half of the thickness T1 of the first metal block 124.

Figure 2D:
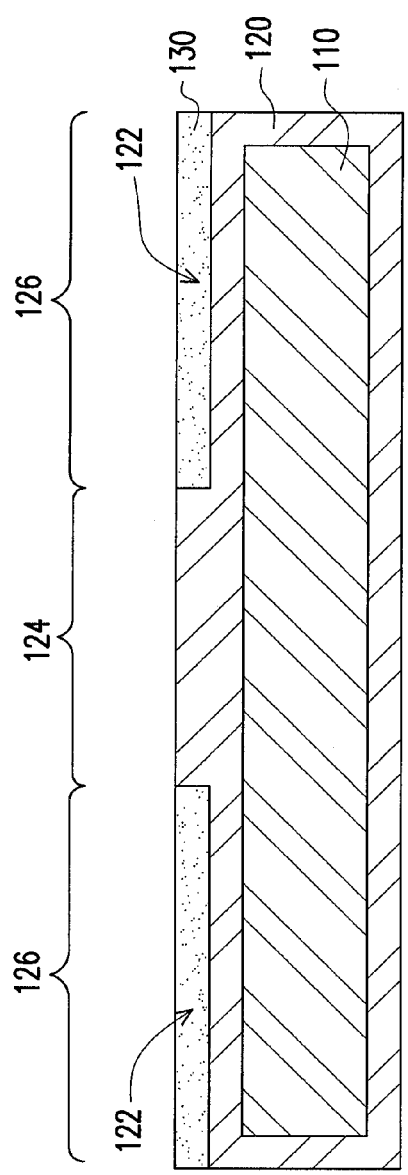
Figure 2G:
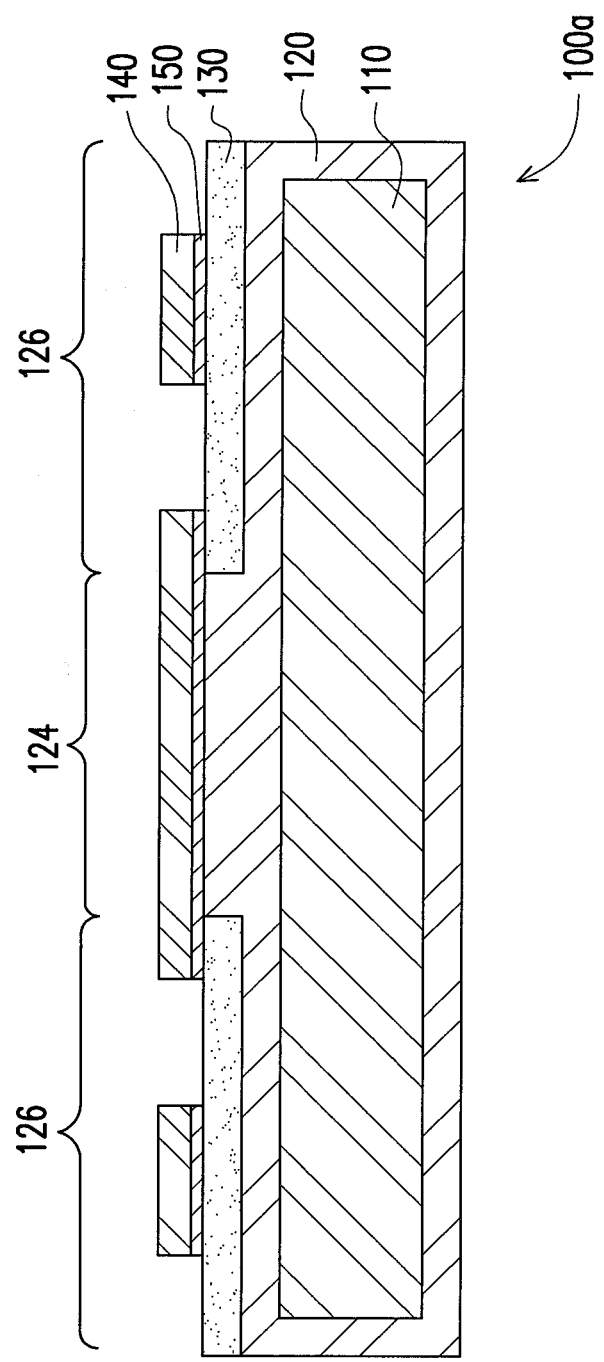

With reference to FIG. 2D, an insulating material layer 130 is formed on the recesses 122, and namely, the insulating material layer 130 is disposed on the second metal block 126. In the embodiment, a method of forming the insulating material layer 130 on the recesses 122 includes thermal compression process or coating process.

Then, in order to facilitate the subsequent process, a surface treatment may be performed to the insulating material layer 130 and to the first metal block 124. With reference to FIG. 2E, an electroplating process is performed so as to form a conductive layer 140a on the insulating material layer 130 and on the first metal block 124. Since the surface treatment is performed on the insulating material layer 130 and on the first metal block 124 before forming the conductive layer 140a, bonding strength between the insulating material layer 130 and the conductive layer 140a, and between the first metal block 124 and the conductive layer 140a, may be enhanced.

Finally, referring to FIG. 2E, a patterning process is performed to the conductive layer 140a so as to form a patterned conductive layer 140 on the insulating material layer 130 and on the first metal block 124. Herein, the patterning process includes a photolithography and etching process. At this point, the manufacture of the heat dissipation substrate 100 is substantially completed.

Noteworthily, in the other embodiments, in order to enhance the bonding strength insulating between the material layer 130 and the conductive layer 140a, and between the first metal block 124 and the conductive layer 140a, a copper foil layer 150 may be laminated on the insulating material layer 130 and on the first metal block 124 before forming the patterned conductive layer 140. Then, utilizing the copper foil layer 150 as the electroplating seed layer to perform the electroplating process for forming the conductive layer 140a on the insulating material layer 130 and on the first metal block 124. Finally, the patterning process is performed to the conductive layer 140a for forming the patterned conductive layer 140 on the insulating material layer 130 and on the first metal block 124, so as to complete the manufacture of a heat dissipation substrate 100a, in reference with FIG. 2G.

In the subsequent process, when the heat generating element (such as a light emitting diode chip) (not shown) is electrically connected to the patterned conductive layer 140 of the heat dissipation substrate 100 (or the heat dissipation substrate 100a) through a wire bonding process or a flip-chip bonding process, the heat generating element may be disposed on the patterned conductive layer 140 above the first metal block 124, and heat generated by the heat generating element may be rapidly dissipated to the exterior directly through the patterned conductive layer 140 (the copper foil layer 150), the first metal block 124 of the metal layer 120 and the metal substrate 110. Briefly, the heat dissipation substrate 100 (or the heat dissipation substrate 100a) of the invention may effectively dissipate heat generated by the heat generating element, so as to improve usage efficiency and durability of the heat generating element.

Since the aluminum substrate is utilized as the metal substrate 110, an overall weight of the heat dissipation substrate 100 (or the heat dissipation substrate 100a) may be lighter compared to the copper substrate of the same volume, and thus may facilitate moving operations and processing operations during the manufacturing process, so as to increase productivity and a process yield. Moreover, since the cost of the aluminum substrate is relatively low compared with the copper substrate of the same volume, the production cost may be reduced. In addition, since the metal layer 120 (a material such as copper) entirely covers the metal substrate 110 (such as the aluminum substrate), during the etching process, the metal substrate 110 is protected from being etched by etchant, thus ensuring integrity and structure reliability of the metal substrate 110.

In summary, since the heat dissipation substrate of the invention utilizes the metal layer to entirely cover the metal substrate, heat generated by a heat generating element may be rapidly conducted to the exterior through the patterned conductive layer, the metal layer and the metal substrate when the heat generating element is disposed on the heat dissipation substrate. Consequently, the heat dissipation substrate of the invention may effectively dissipate hear generated by the heat generating element, so as to improve usage efficiency and durability of the heat generating element.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A heat dissipation substrate comprising:
   a metal substrate;
   a metal layer disposing on the metal substrate and entirely covering the metal substrate, wherein the metal layer has a first metal block and a second metal block surrounding the first metal block, and a thickness of the first metal block is greater than a thickness of the second metal block;
   an insulating material layer disposing on the second metal block; and
   a patterned conductive layer disposing on the insulating material layer and on the first metal block.

2. The heat dissipation substrate as recited in claim 1, wherein the metal substrate comprises an aluminum substrate.

3. The heat dissipation substrate as recited in claim 1, wherein a material of the metal layer comprises copper.

4. The heat dissipation substrate as recited in claim 1, wherein the thickness of the second metal block is less than or equal to half of the thickness of the first metal block.

5. A manufacturing method of a heat dissipation substrate comprising:
   providing a metal substrate;
   forming a metal layer on the metal substrate, wherein the metal layer entirely covers the metal substrate;
   forming a plurality of recesses on the metal layer, wherein the recesses define the metal layer into a first metal block and a second metal block surrounding the first metal block, and a thickness of the first metal block is greater than a thickness of the second metal block;
   forming an insulating material layer on the recesses; and
   forming a patterned conductive layer on the insulating material layer and on the first metal block.

6. The manufacturing method of the heat dissipation substrate as recited in claim 5, wherein a method of forming the recesses on the metal layer comprises a half-etching process.

7. The manufacturing method of the heat dissipation substrate as recited in claim 6, wherein the thickness of the second metal block is less than or equal to half of the thickness of the first metal block.

8. The manufacturing method of the heat dissipation substrate as recited in claim 5, wherein a method of forming the insulating material layer on the recesses comprises thermal compression process or coating process.

9. The manufacturing method of the heat dissipation substrate as recited in claim 5, wherein the steps for forming patterned conductive layer comprises:
   performing a surface treatment to the insulating material layer and on the first metal block;
   performing an electroplating process for forming a conductive layer on the insulating material layer and on the first metal block; and
   performing a patterning process to the conductive layer for forming the patterned conductive layer.

10. The manufacturing method of the heat dissipation substrate as recited in claim 5 further comprising:
   laminating a copper foil layer on the insulating material layer and on the first metal block before forming the patterned conductive layer.

* * * * *